United States Patent
Xu et al.

(10) Patent No.: US 10,056,410 B2
(45) Date of Patent: Aug. 21, 2018

(54) METHOD FOR MANUFACTURING ARRAY SUBSTRATE, AND ARRAY SUBSTRATE, DISPLAY PANEL AND DISPLAY DEVICE

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Chuanzhi Xu, Shanghai (CN); Zhengfang Xie, Shanghai (CN); Xiongping Li, Shanghai (CN); Xiaoyang Tong, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/403,131

(22) Filed: Jan. 10, 2017

(65) Prior Publication Data
US 2017/0148825 A1 May 25, 2017

(51) Int. Cl.
*H01L 27/12* (2006.01)
*G02F 1/1343* (2006.01)
(Continued)

(52) U.S. Cl.
CPC ........ *H01L 27/1225* (2013.01); *G02F 1/1368* (2013.01); *G02F 1/13439* (2013.01); *G02F 1/134309* (2013.01); *H01L 21/441* (2013.01); *H01L 21/467* (2013.01); *H01L 27/127* (2013.01); *H01L 29/24* (2013.01); *H01L 29/42356* (2013.01); *H01L 29/66969* (2013.01);
(Continued)

(58) Field of Classification Search
CPC .......... H01L 27/1225; G02F 1/134309; G02F 1/13439; G02F 1/1368
See application file for complete search history.

(56) References Cited

U.S. PATENT DOCUMENTS

2015/0249161 A1* 9/2015 Su ..................... H01L 21/02565 257/43

FOREIGN PATENT DOCUMENTS

CN 103311126 A 9/2013
JP 2007258675 A * 10/2007

* cited by examiner

*Primary Examiner* — Sitaramarao S Yechuri
(74) *Attorney, Agent, or Firm* — Kilpatrick Townsend & Stockton LLP

(57) ABSTRACT

A method for manufacturing an array substrate, and an array substrate, a display panel and a display device are provided. The method may include: forming, on one side of a substrate, a gate electrode layer, a gate insulation layer and a semiconductor layer, wherein the gate electrode layer has a same pattern as the semiconductor layer; forming an etching stop layer on the semiconductor layer; forming a first, second hole and third through holes by patterning the etching stop layer; forming a source electrode layer and a drain electrode layer on the etching stop layer, wherein the source electrode layer is electrically connected with the semiconductor layer via the first through hole, and the drain electrode layer is electrically connected with the semiconductor layer via the second through hole; forming an active layer by etching the semiconductor layer at the location corresponding to the third through hole.

19 Claims, 18 Drawing Sheets

(51) Int. Cl.
*G02F 1/1368* (2006.01)
*H01L 21/441* (2006.01)
*H01L 21/467* (2006.01)
*H01L 29/24* (2006.01)
*H01L 29/423* (2006.01)
*H01L 29/66* (2006.01)
*H01L 29/786* (2006.01)
*G02F 1/1362* (2006.01)

(52) U.S. Cl.
CPC ............... *H01L 29/7869* (2013.01); *G02F 2001/136231* (2013.01); *G02F 2201/122* (2013.01)

METHOD FOR MANUFACTURING ARRAY SUBSTRATE, AND ARRAY SUBSTRATE, DISPLAY PANEL AND DISPLAY DEVICE

CROSS-REFERENCES TO RELATED APPLICATIONS

This application claims priority to a Chinese patent application No. 201610848316.5 filed on Sep. 23, 2016 and entitled "METHOD FOR MANUFACTURING ARRAY SUBSTRATE, AND ARRAY SUBSTRATE, DISPLAY PANEL AND DISPLAY DEVICE", the disclosure of which is incorporated herein by reference in its entirety.

TECHNICAL FIELD

The present disclosure relates to liquid crystal display technologies, and in particular, to a method for manufacturing an array substrate, an array substrate, a display panel and a display device.

BACKGROUND

With the development of display technologies, the display effect of liquid crystal display products is improved increasingly, so that the application of liquid crystal display products becomes wider and wider.

In the conventional process of manufacturing an array substrate of the liquid crystal display product, many working procedures are required, a mask plate needs to be manufactured in the manufacturing process for each of film layers, and hence film forming, exposing and etching are all required therefor, which leads to the complex process and the high cost.

SUMMARY

The disclosure provides a method for manufacturing an array substrate, and an array substrate, a display panel and a display device, thereby lowering the process cost and the process complexity for manufacturing an array substrate.

In a first aspect, the disclosure provides a method for manufacturing an array substrate. The method includes: forming, on one side of a substrate, a gate electrode layer, a gate insulation layer located on the gate electrode layer and a semiconductor layer located on the gate insulation layer, where the gate electrode layer has a same pattern as the semiconductor layer; forming an etching stop layer on the semiconductor layer; forming a first through hole, a second through hole and a third through hole by patterning the etching stop layer; forming a source electrode layer and a drain electrode layer on the etching stop layer, where, the source electrode layer is electrically connected with the semiconductor layer via the first through hole, and the drain electrode layer is electrically connected with the semiconductor layer via the second through hole; and forming an active layer by etching the semiconductor layer at the location corresponding to the third through hole, wherein, the gate electrode layer comprises a first part at the location corresponding to the third through hole and a second part, the second part of the gate electrode layer having a same pattern as the active layer and being different from the first part.

In a second aspect, the disclosure further provides an array substrate. The array substrate includes: a substrate; a gate electrode layer located on the substrate; a gate insulation layer located on the gate electrode layer; an active layer located on the gate insulation layer; an etching stop layer located on the active layer; and a source electrode layer and a drain electrode layer located on the etching stop layer; where the etching stop layer is provided with a first through hole, a second through hole and a third through hole; the source electrode layer is connected with the active layer via the first through hole, and the drain electrode layer is connected with the active layer via the second through hole; the active layer is disconnected at a location corresponding to the third through hole, the gate electrode layer comprises a first part at the location corresponding to the third through hole and a second part except for the first part, and the second part of the gate electrode layer has a same pattern as the active layer.

In a third aspect, the disclosure further provides a display panel. The display panel includes the array substrate according to any embodiment of the disclosure.

In a fourth aspect, the disclosure further provides a display device. The display device includes the display panel according to any embodiment of the disclosure.

DETAILED DESCRIPTION

The disclosure will be further illustrated in detail below in conjunction with the drawings and embodiments. It may be understood that, the embodiments described here are only set for explaining, rather than limiting, the disclosure. Additionally, it further needs to be noted that, for convenient description, the drawings only show the parts related to the disclosure, rather than the whole structure.

A number of working procedures are required in the manufacturing process of an array substrate in the related art; for example, a mask plate needs to be manufactured for each of a gate electrode layer and an active layer, and film forming, exposing and etching, etc., all need to be performed thereon, so that the process cost is high, and the number of working procedures is large. Moreover, during the manufacturing process, the gate electrode layer and the active layer need to be aligned, which has a strict requirement on the process. In order to solve the above problem, this embodiment provides a method for manufacturing an array substrate.

Figure 1:
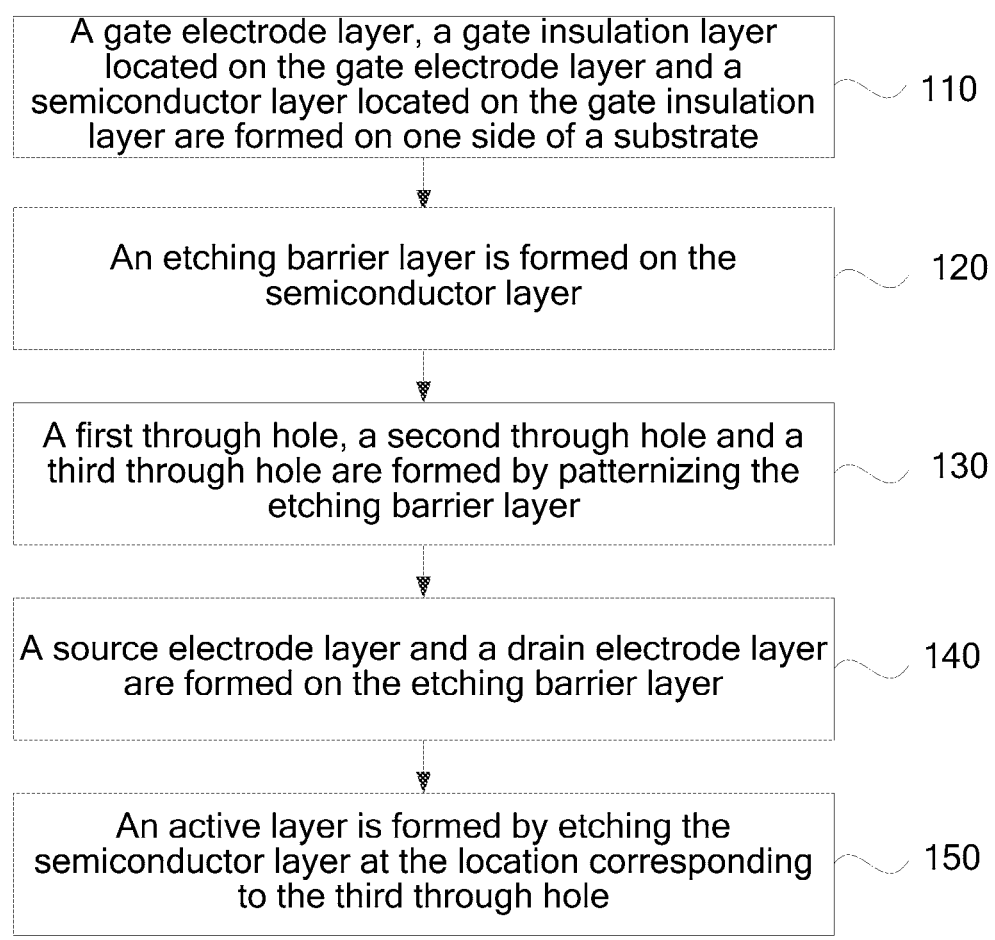
FIG. 1 is a flow chart of a method for manufacturing an array substrate according to one embodiment.

FIG. 1 is a flow chart of a method for manufacturing an array substrate according to one embodiment. Referring to FIG. 1, the method includes:

Step 110: A gate electrode layer, a gate insulation layer located on the gate electrode layer and a semiconductor layer located on the gate insulation layer are formed on one side of a substrate, wherein, the gate electrode layer has a same pattern as the semiconductor layer.

Figure 2A:
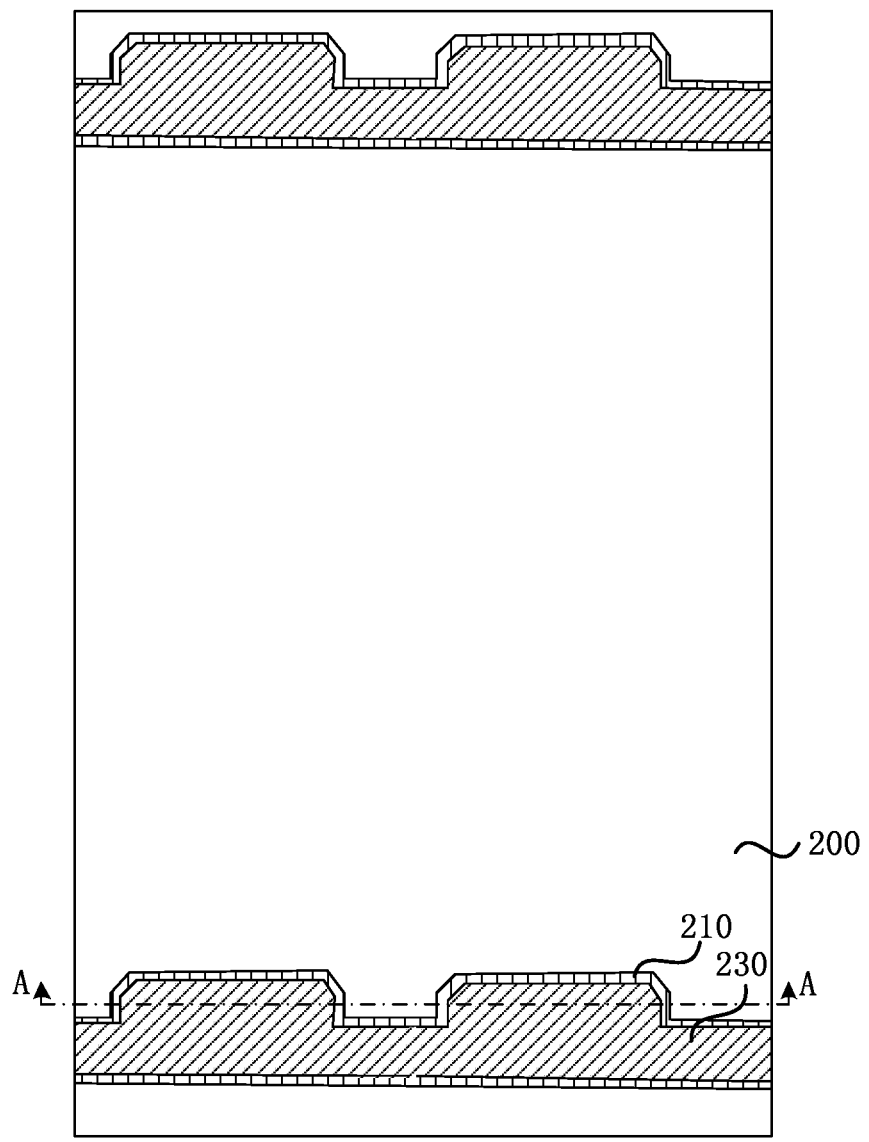
FIG. 2A is a plan view of a gate electrode layer, a gate insulation layer and a semiconductor layer according to one embodiment.
Figure 2B:
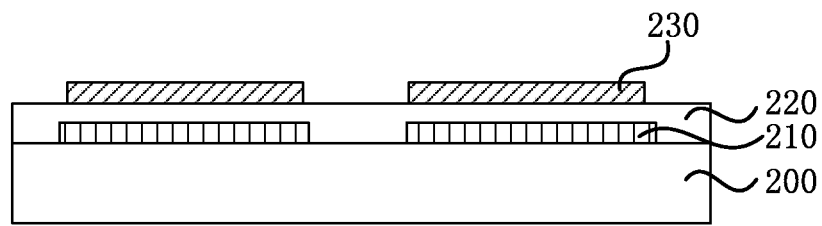
FIG. 2B is a sectional view of FIG. 2A along section line A-A.

Specifically, FIG. 2A is a plan view of a gate electrode layer, a gate insulation layer and a semiconductor layer according to one embodiment, and FIG. 2B is a sectional view of FIG. 2A along section line A-A. Referring to FIG. 2A and FIG. 2B, a gate electrode layer 210 has a same pattern as a semiconductor layer 230, so that during forming of the semiconductor layer 230, a gate electrode layer mask plate may be employed or the gate electrode layer 210 may be taken as a mask. It should be noted that, no gate insulation layer 220 is shown in FIG. 2A.

Figure 2C:
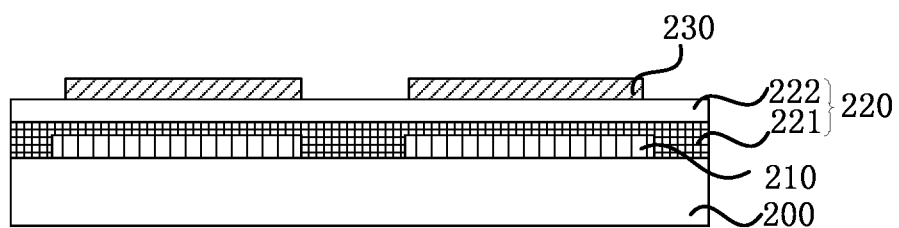
FIG. 2C is a schematic diagram of a gate insulation layer according to one embodiment.

Specifically, referring to FIG. 2B, a gate insulation layer 220 covers the gate electrode layer 210, the gate insulation layer 220 may be made of an oxide of silicon. FIG. 2C is a schematic diagram of a gate insulation layer according to one embodiment. Referring to FIG. 2C, the gate insulation layer 220 may also be a multilayer structure that includes a first insulation layer 221 and a second insulation layer 222. The first insulation layer 221 is provided on one side of the second insulation layer 222 that is adjacent to the gate electrode layer 210, and the first insulation layer 221 may be made of a nitride of silicon, for example, silicon nitride; and the second insulation layer 222 may be made of an oxide of silicon, for example, silicon dioxide.

Figure 2D:
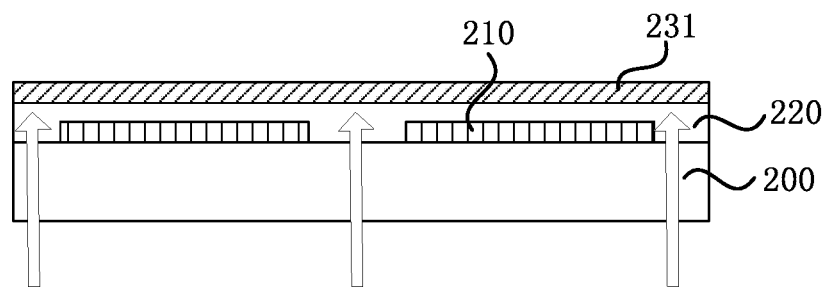
FIG. 2D is a diagram showing the formation process of a gate electrode layer, a gate insulation layer and a semiconductor layer according to one embodiment.

FIG. 2D is a diagram showing the formation process of a gate electrode layer, a gate insulation layer and a semiconductor layer according to one embodiment. Referring to FIG. 2B and FIG. 2D, the gate electrode layer 210, the gate insulation layer 220 and the semiconductor layer 230 may be formed by the following process: a first metal layer is formed on a substrate 200, and a gate electrode layer 210 is formed by patterning the first metal layer; a gate insulation layer 220 is formed on the gate electrode layer 210; a semiconductor material layer 231 is formed on the gate insulation layer 220, and a semiconductor layer 230 is formed by patterning the semiconductor material layer 231 by taking the gate electrode layer 210 as a mask plate. By taking the gate electrode layer 210 as a mask plate, the semiconductor material layer 231 is patterned via back exposing (i.e., the light source is disposed on one side of the gate electrode layer 210 that is away from the substrate 200) so as to form the semiconductor layer 230, so that no additional mask plate needs to be provided, thereby saving the process cost. In addition, the gate electrode layer 210 is taken as a mask plate, so that the formed semiconductor layer 230 may be automatically aligned with the gate electrode layer 210, thereby lowering the process difficulty, and reducing the number of process steps.

Figure 2E:
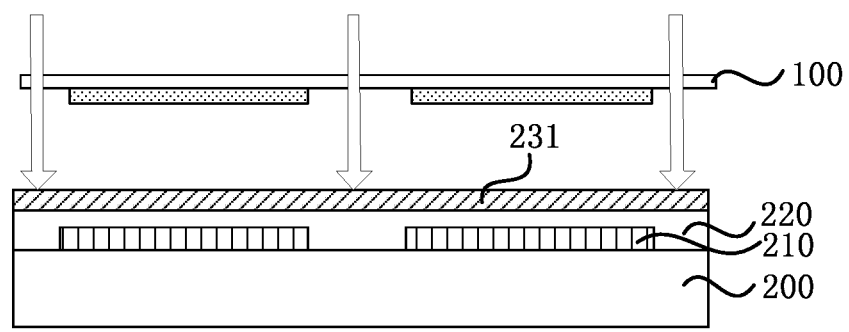
FIG. 2E is a diagram showing the formation process of a gate electrode layer, a gate insulation layer and a semiconductor layer according to another embodiment of the disclosure.

FIG. 2E is a diagram showing the formation process of a gate electrode layer, a gate insulation layer and a semiconductor layer according to another embodiment. Referring to FIG. 2B and FIG. 2E, the gate electrode layer 210, the gate insulation layer 220 and the semiconductor layer 230 may also be formed by the following process: a first metal layer is formed on a substrate 200, and a gate electrode layer 210 is formed by patterning the first metal layer; a gate insulation layer 220 is formed on the gate electrode layer 210; a semiconductor material layer 231 is formed on the gate insulation layer 220; and a semiconductor layer 230 is formed by patterning the semiconductor material layer 231 by employing the gate electrode layer mask plate 100 that forms the gate electrode layer 210.

Specifically, the semiconductor layer 230 is formed by employing the gate electrode layer mask plate 100, so that no additional mask plate needs to be provided, thereby saving the process cost, and further, the semiconductor layer 230 formed by the gate electrode layer mask plate 100 may be automatically aligned with the gate electrode layer 210, thereby lowering the process difficulty, and reducing the number of process steps.

It may be understood that, a sectional view of the gate electrode layer, the gate insulation layer and the semiconductor layer formed by employing the forming process chart of the gate electrode layer, the gate insulation layer and the semiconductor layer provided in FIG. 2d or FIG. 2e may be as shown in FIG. 2B or FIG. 2C.

Figure 2F:
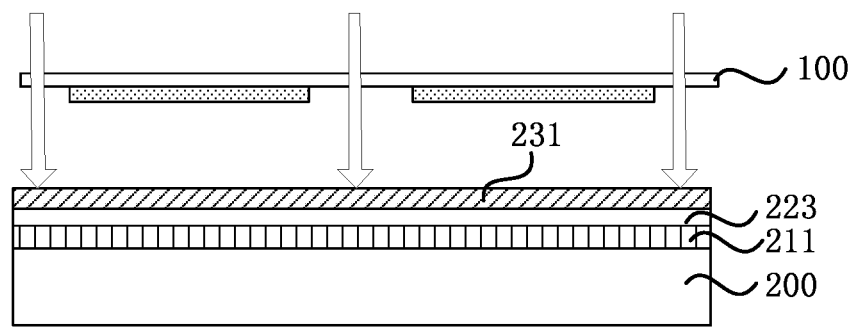
FIG. 2F is a diagram showing the formation process of a gate electrode layer, a gate insulation layer and a semiconductor layer according to another embodiment of the disclosure.

FIG. 2F is a diagram showing the formation process of a gate electrode layer, a gate insulation layer and a semiconductor layer according to another embodiment. Referring to FIG. 2B and FIG. 2F, the gate electrode layer 210, the gate insulation layer 220 and the semiconductor layer 230 may also be formed by the following process: a first metal layer 211, a first insulation layer 223 and a semiconductor material layer 231 are formed on a substrate 200; and a semiconductor layer 230, a gate insulation layer 220 and a gate electrode layer 210 are formed by patterning the first metal layer 211, the first insulation layer 223 and the semiconductor material layer 231 via a one-time patterning process by using the gate electrode layer mask plate 100.

Figure 2G:
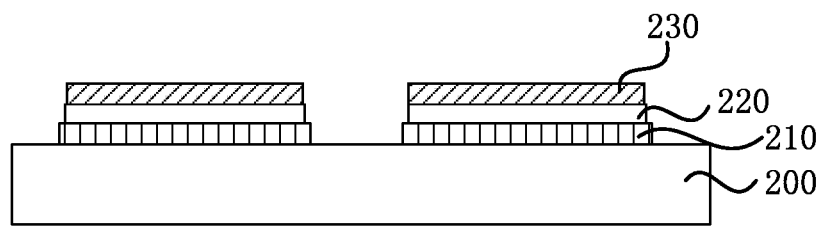
FIG. 2G is another sectional view of FIG. 2A along section line A-A.

Specifically, the semiconductor layer 230, the gate insulation layer 220 and the gate electrode layer 210 are formed via a one-time patterning process by using the gate electrode layer mask plate 100, where the semiconductor layer 230 and the gate electrode layer 210 use the same mask plate, so that there is no need to provide mask plates, respectively, thereby saving the process cost. Moreover, the semiconductor layer 230 may be automatically aligned with the gate electrode layer 210, thereby lowering the process difficulty, and reducing the number of process steps. In addition, the gate insulation layer 220 formed by employing the process shown in FIG. 2F has the same shape as the gate electrode layer 210 and the semiconductor layer 230. As shown in FIG. 2G; it is another sectional view of FIG. 2A along section line A-A.

Step 120: An etching stop layer is formed on the semiconductor layer 230.

Figure 3A:
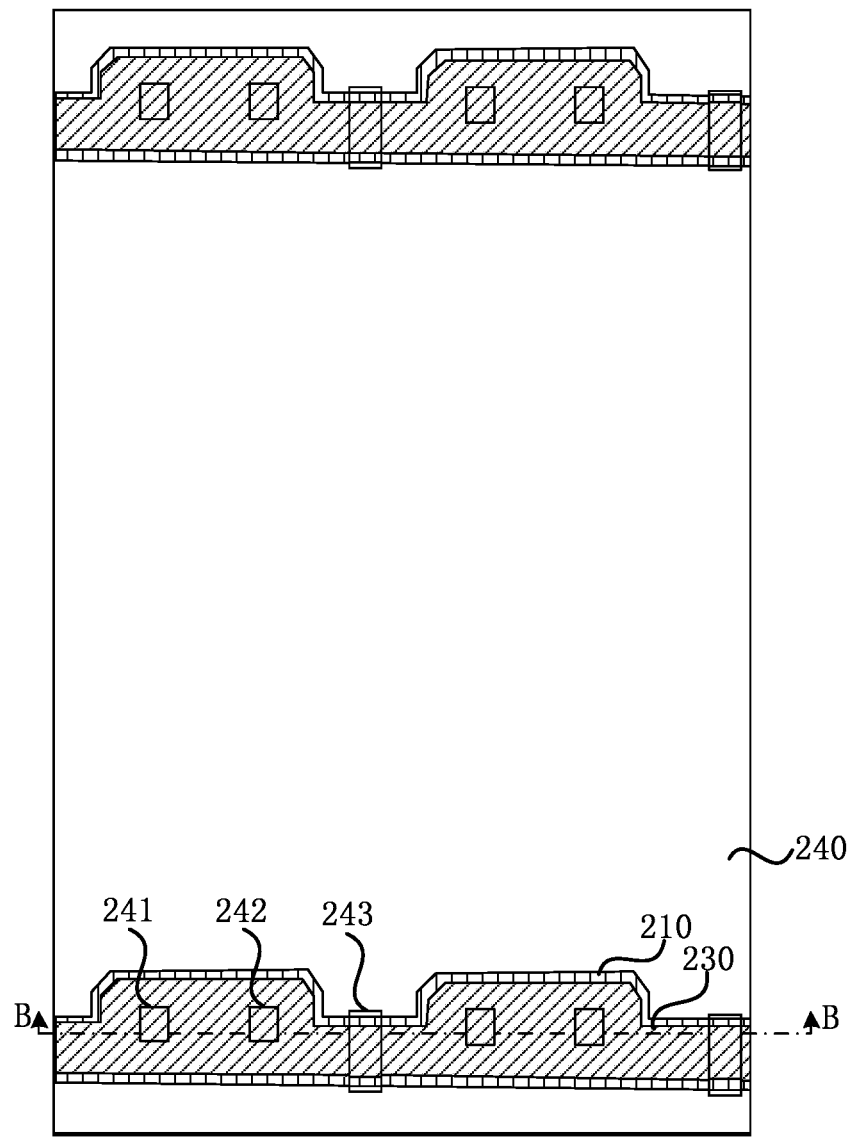
FIG. 3A is a plan view of an etching stop layer formed according to one embodiment.
Figure 3B:
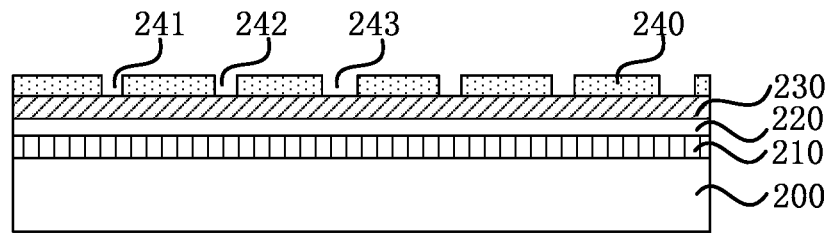
FIG. 3B is a sectional view of FIG. 3A along section line B-B.

FIG. 3A is a plan view of an etching stop layer formed according to one embodiment, and FIG. 3B is a sectional view of FIG. 3a along section line B-B. Referring to FIG. 3A and FIG. 3B, an etching stop layer 240 covers the semiconductor layer 230. During the manufacturing process of a thin-film transistor, because the semiconductor layer 230 is subject to be damaged, an etching stop layer 240 is manufactured on the semiconductor layer in order to protect the semiconductor layer.

Step 130: A first through hole 241, a second through hole 242 and a third through hole 243 are formed by patterning the etching stop layer 240.

Specifically, the etching stop layer 240 has a planar shape, and hence it may be formed via only one etching; in comparison with an island-shaped etching stop layer, no multiple-times etchings or ashings are needed, thereby saving working procedures, and lowering the difficulty of the manufacturing process.

Step 140: A source electrode layer and a drain electrode layer are formed on the etching stop layer 240.

Figure 4A:
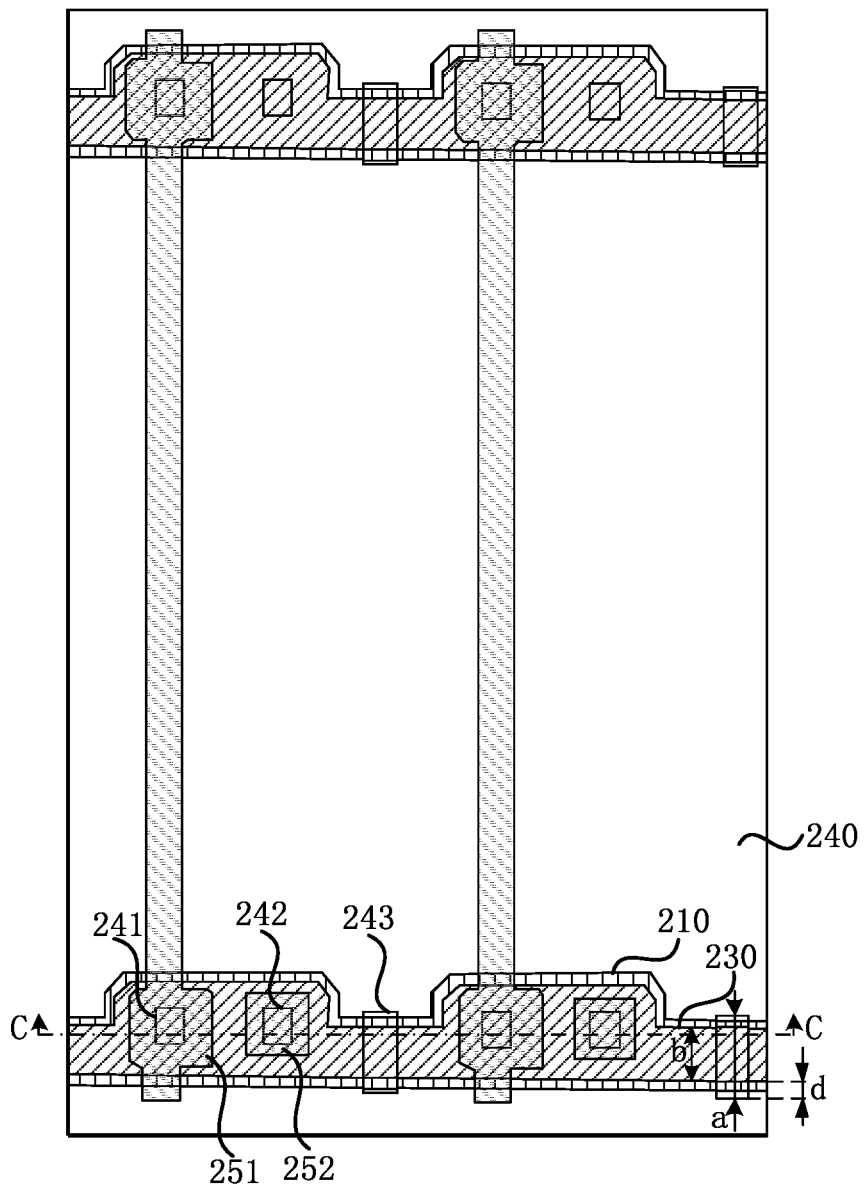
FIG. 4A is a plan view of a source-drain electrode layer formed according to one embodiment.
Figure 4B:
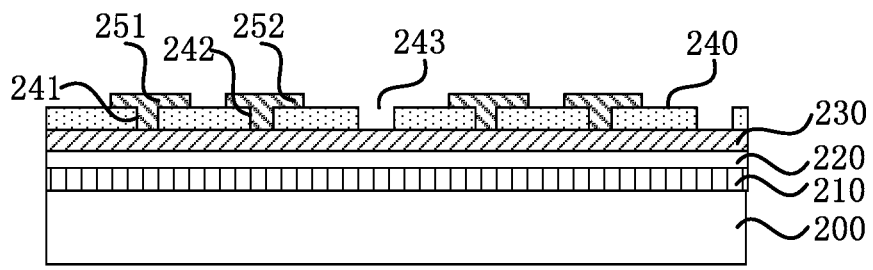
FIG. 4B is a sectional view of FIG. 4A along section line C-C.

FIG. 4A is a plan view of a source-drain electrode layer formed according to one embodiment, and FIG. 4B is a sectional view of FIG. 4A along section line C-C. Referring to FIG. 4A and FIG. 4B, a source electrode layer 251 is electrically connected with the semiconductor layer 230 via the first through hole 241, and a drain electrode layer 252 is electrically connected with the semiconductor layer 230 via the second through hole 242. Specifically, the source electrode layer 251 and the drain electrode layer 252 are electrically connected with the semiconductor layer 230 via the corresponding through holes, respectively, and the length of the channel region of the thin-film transistor may be adjusted easily by adjusting the distance between the first through hole 241 and the second through hole 242. In addition, because the size control precision is high when the through holes are formed, the sizes of the through holes may be adjusted accurately, so that the contact resistance between the source electrode layer 251 and the semiconductor layer 230 and the contact resistance between the drain electrode layer 252 and the semiconductor layer 230 may be adjusted accurately, and thereby the manufacture precision of the thin-film transistor and the array substrate may be improved. In addition, the source electrode layer 251 and the drain electrode layer 252 are formed on the planar-shaped etching stop layer 240, so that after film forming, an ordinary common mask plate may be employed for exposing and etching, and no expensive half-tone mask plate is required, thereby the lowering process cost and the process difficulty.

Step 150: An active layer is formed by etching the semiconductor layer 230 at the location corresponding to the third through hole 243.

Figure 5A:
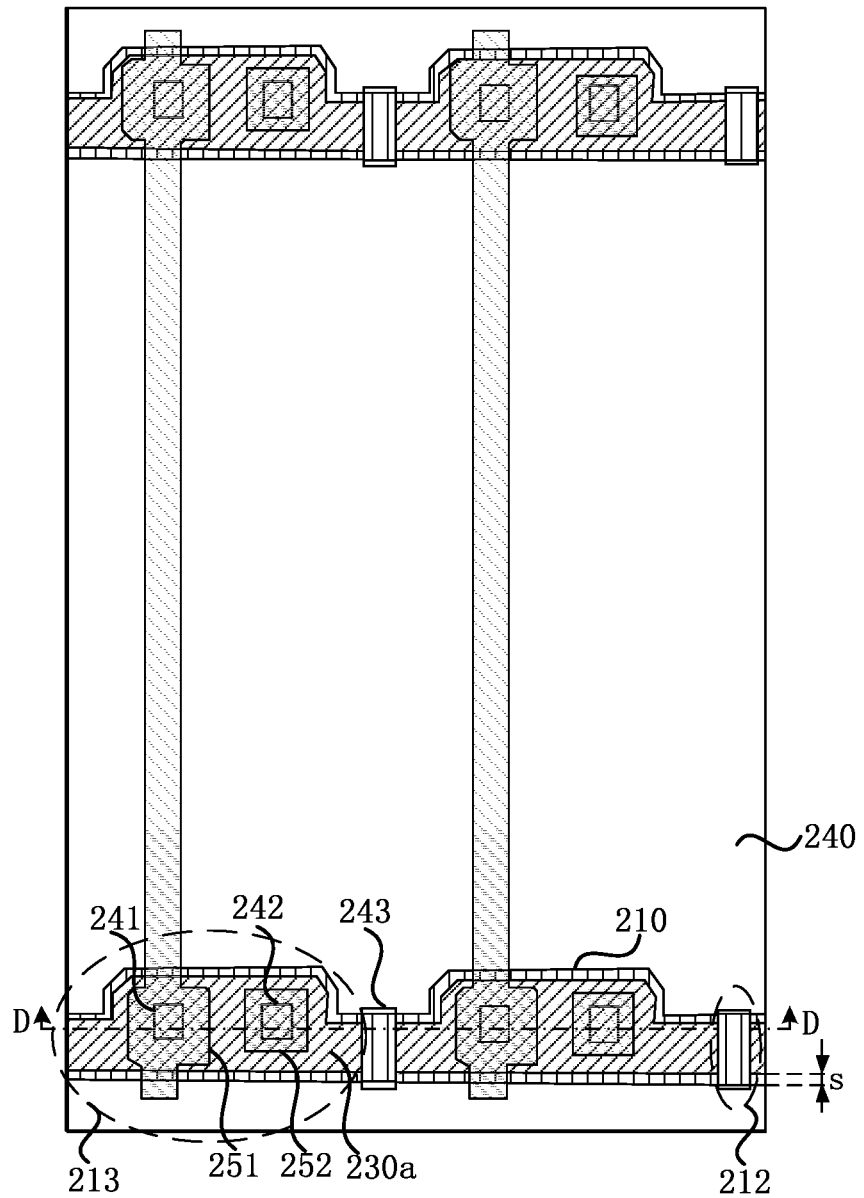
FIG. 5A is a plan view of an active layer formed according to one embodiment.
Figure 5B:
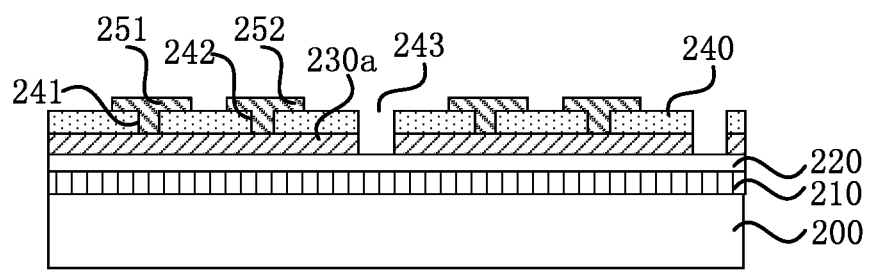
FIG. 5B is a sectional view of FIG. 5A along section line D-D.

FIG. 5A is a plan view of an active layer formed according to one embodiment, and FIG. 5B is a sectional view of FIG. 5A along section line D-D. Referring to FIG. 5A and FIG. 5B, the gate electrode layer 210 includes a first part 212 at the location corresponding to the third through hole 243 and a second part 213 other than the first part 212. The second part 213 of the gate electrode layer 210 has a same pattern as the active layer 230a. Specifically, because the semiconductor layer 230 and the gate electrode layer 210 have the same shape and are aligned automatically, the active layer 230a formed after etching the semiconductor layer 230 at the location corresponding to the third through hole 243 has the same as the second part 213 of the gate electrode layer 210, and the gate electrode layer 210 and the active layer 230a are aligned automatically, thereby reducing the working procedures and lowering the process difficulty.

In the solution of this embodiment, the shape of the gate electrode layer is provided the same as that of the semiconductor layer, and a first through hole, a second through hole and a third through hole are provided on the etching stop layer, the source electrode layer is electrically connected with the semiconductor layer via the first through hole, the drain electrode layer is electrically connected with the semiconductor layer via the second through hole, and an active layer is formed by etching the semiconductor layer at the location corresponding to the third through hole, so that the manufacturing process of the active layer may be simplified, and hence no additional active layer mask plate needs to be provided, thereby saving the process cost, and further, the active layer and the gate electrode layer may be aligned automatically, thus lowering the process difficulty.

Optionally, the material of the active layer 230a may be a metal oxide semiconductor. A fracture structure may be formed in the semiconductor layer 230 by removing the semiconductor layer 230 exposed at the location corresponding to the third through hole 243 by means of a first etching solution for forming the source electrode layer 251 and the drain electrode layer 252 or by means of a metal oxide semiconductor etching solution, so as to form the active layer 230a.

Specifically, after the source electrode layer 251 and the drain electrode layer 252 are formed, the location of the semiconductor layer 230 corresponding to the third through hole 243 may be etched off by continuing etching by using the first etching solution for forming the source electrode layer 251 and the drain electrode layer 252. If the first etching solution cannot etch off the semiconductor layer 230, or if dry etching, etc., is employed when forming the source electrode layer 251 and the drain electrode layer 252, a metal oxide semiconductor etching solution may be used for removing the semiconductor layer 230 exposed at the location corresponding to the third through hole 243.

Optionally, the material of the active layer 230a may be indium gallium zinc oxide (IGZO). IGZO is an amorphous oxide containing indium, gallium and zinc, and the carrier mobility thereof is 20~30 times of that of amorphous silicon, and thus the charging and discharging speed of the thin-film transistor on the pixel electrode may be improved greatly, response speed of the pixel may be improved to realize a higher refresh rate, and also the line scanning speed of pixels may be improved greatly due to faster response.

Optionally, referring to FIG. 4A, along a direction perpendicular to the extension direction of the gate electrode layer 210, the length a of the third through hole 243 is larger than the length b of the semiconductor layer 230 exposed at the location corresponding to the third through hole 243. Referring to FIG. 5A, by setting the length a of the third through hole 243 as larger than the length b of the semiconductor layer 230, the semiconductor layer 230 at the location corresponding to the third through hole 243 can be made completely exposed, thus ensuring that the semiconductor layer 230 can be completely etched off during etching, so as to form a plurality of thin-film transistors.

Optionally, referring to FIG. 4A, along a direction perpendicular to the extension direction of the gate electrode layer 210, the range difference d between the vertical projection of the boundary of the third through hole 243 on the substrate 200 and the vertical projection of the boundary of the semiconductor layer 230 on the substrate 200 is greater than or equal to 1.5 µm. By such a setting, the two boundaries of the semiconductor layer 230 at the location corresponding to the third through hole 243 can both be exposed, thus further ensuring that the semiconductor layer 230 can be completely etched off during etching, and the setting in which d is set as greater than or equal to 1.5 µm is easily realized in the process, thus lowering the process difficulty.

Optionally, referring to FIG. 5A, the vertical projection of the active layer 230a on the substrate 200 is located inside the vertical projection of the gate electrode layer 210 on the substrate 200. By such a setting, the gate electrode layer 210 can completely block the active layer 230a, thus preventing photocurrent from being generated due to the irradiation of the light source of the display panel on the active layer, so that the leakage current of the thin-film transistor may be reduced. Specifically, during the forming of the semiconductor layer 230, the size of the semiconductor layer 230 may be adjusted by adjusting the exposure intensity, the exposure time, the concentration of the etching solution or the etching time, etc., so that the size of the active layer 230a may be adjusted to ensure that the vertical projection of the active layer 230a on the substrate 200 is located inside the vertical projection of the gate electrode layer 210 on the substrate 200.

Optionally, referring to FIG. 5A, the range difference s between the vertical projection of the boundary of the gate electrode layer 210 on the substrate 200 and the vertical projection of the boundary of the active layer 230a on the substrate 200 is greater than or equal to 1 μm. By such a setting, it may ensure that the vertical projection of the active layer 230a on the substrate 200 is located inside the vertical projection of the gate electrode layer 210 on the substrate 200, thereby ensuring that the gate electrode layer 210 can completely block the active layer 230a, and preventing photocurrent from being generated due to the irradiation of the light source of the display panel on the active layer, so that the leakage current of the thin-film transistor may be reduced.

Figure 6:
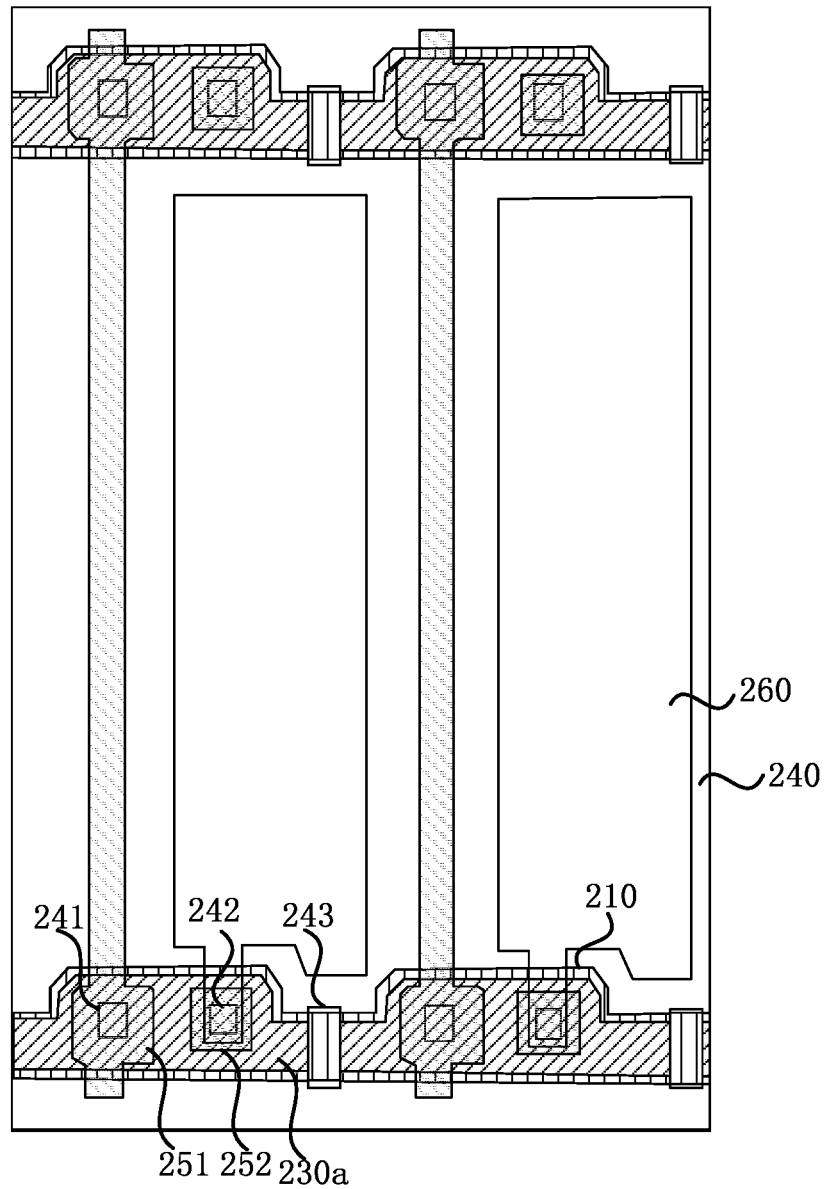
FIG. 6 is a plan view of a pixel electrode formed according to one embodiment.

FIG. 6 is a plan view of a pixel electrode formed according to one embodiment. Referring to FIG. 6, after the active layer 230a is formed, a pixel electrode 260 is formed above the drain electrode layer 252, and the pixel electrode 260 is electrically connected with the drain electrode layer 252, and the pixel electrode 260 may have a planar shape.

Figure 7:
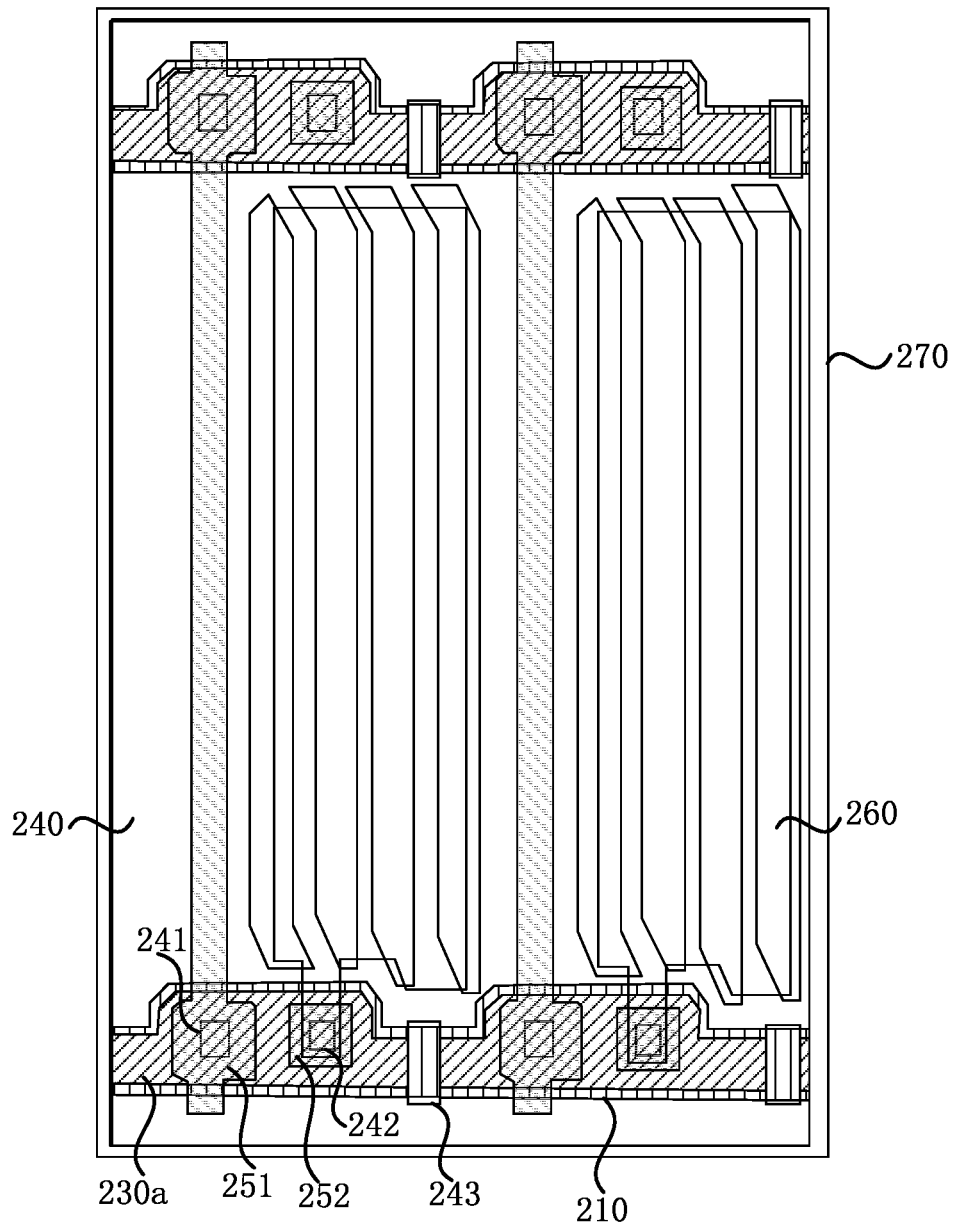
FIG. 7 is a plan view of a common electrode formed according to one embodiment.

FIG. 7 is a plan view of a common electrode formed according to one embodiment. Referring to FIG. 7, after the pixel electrode 260 is formed, a common electrode 270 is formed on the pixel electrode 260, wherein the common electrode 270 has a strip slit for forming electric field-driven liquid crystals with the pixel electrode 260.

It should be noted that, FIG. 7 only exemplarily shows the outline of the common electrode 270, rather than limiting the disclosure. In addition, this embodiment only exemplarily shows the case in which the common electrode 270 is located on one side of the pixel electrode 260 that is away from the substrate 200, rather than limiting the disclosure. In other implementation, the pixel electrode 260 may also be located on one side of the common electrode 270 that is away from the substrate 200, and the pixel electrode 260 may also be provided on the same layer as the common electrode 270.

This embodiment further provides an array substrate. Referring to FIG. 5A and FIG. 5B, the array substrate includes: a substrate 200, a gate electrode layer 210 located on the substrate 200, a gate insulation layer 220 located on the gate electrode layer 210, an active layer 230a located on the gate insulation layer 220, an etching stop layer 240 located on active layer 230a, and a source electrode layer 251 and a drain electrode layer 252 located on the etching stop layer 240.

The etching stop layer 240 is provided with a first through hole 241, a second through hole 242 and a third through hole 243. The source electrode layer 251 is connected with the active layer 230a via the first through hole 241, and the drain electrode layer 252 is connected with the active layer 230a via the second through hole 242. The active layer 230a is disconnected at the location corresponding to the third through hole 243, and the gate electrode layer 210 includes a first part 212 at the location corresponding to the third through hole 243 and a second part 213 except for the first part 212, wherein the second part 213 of the gate electrode layer 210 has a same pattern as the active layer 230a.

Further, the vertical projection of the active layer 230a on the substrate 200 may be located inside the vertical projection of the gate electrode layer 210 on the substrate 200.

Further, the range difference s between the vertical projection of the boundary of the gate electrode layer 210 on the substrate 200 and the vertical projection of the boundary of the active layer 230a on the substrate 200 may be greater than or equal to 1 μm.

Further, the material of the active layer 230a may optionally be a metal oxide semiconductor.

Further, the material of the active layer 230a may optionally be an indium gallium zinc oxide.

Figure 8:
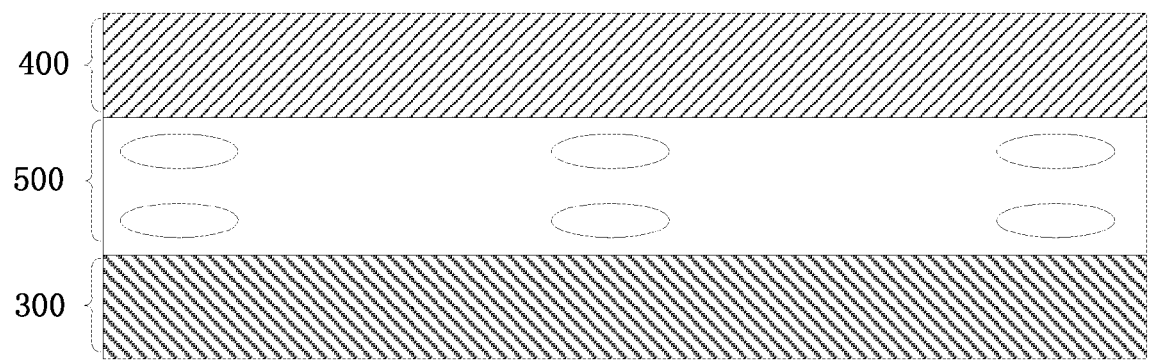
FIG. 8 is a structural representation of a display panel according to one embodiment.

One embodiment further provides a display panel. FIG. 8 is a structural representation of a display panel according to one embodiment. Referring to FIG. 8, the display panel includes an array substrate 300 according to any embodiment of the disclosure. The display panel further includes a color filter substrate 400 that is provided opposite to the array substrate 300 and a liquid crystal layer 500 that is located between the array substrate 300 and the color filter substrate 400.

Figure 9:
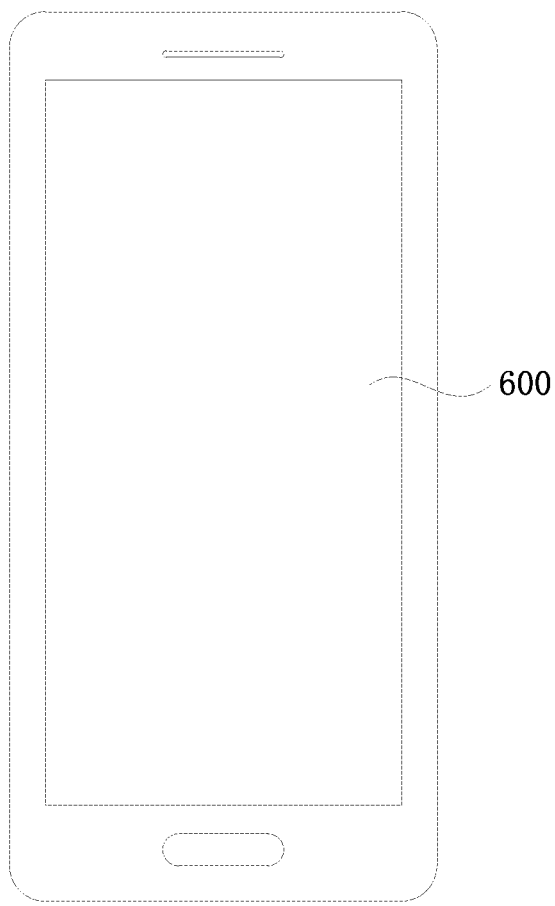
FIG. 9 is a structural representation of a display panel according to one embodiment.

One embodiment further provides a display device. FIG. 9 is a structural representation of a display panel according to one embodiment. Referring to FIG. 9, the display device includes a display panel 600 according to any embodiment of the disclosure.

The array substrate according to this embodiment and the method for manufacturing an array substrate according to any embodiment of the disclosure belong to one and the same inventive concept and have the corresponding beneficial effects. For the technical details that are not described in detail in this embodiment, reference may be made to the method for manufacturing an array substrate according to any embodiment of the disclosure.

It should be noted that the above only show some preferred embodiments of the invention and the technical principles applied. It will be understood by one skilled in the art that the invention should not be limited to the specific embodiments herein, and various apparent variations, readjustments and substitutions can be made by one skilled in the art without departing from the protection scope of the invention. Thus, although the invention has been illustrated in detail by the above embodiments, the invention is not limited to the above embodiments, and other equivalent embodiments may be included without departing from the concept of the invention.

What is claimed is:

1. A method for manufacturing an array substrate, comprising:
    forming, on one side of a substrate, a gate electrode layer, a gate insulation layer located on the gate electrode layer and a semiconductor layer located on the gate insulation layer, wherein, the gate electrode layer has a same pattern as the semiconductor layer;
    forming an etching stop layer on the semiconductor layer;
    forming a first through hole, a second through hole and a third through hole in the etching stop layer by patterning the etching stop layer;

forming a source electrode layer and a drain electrode layer on the etching stop layer, wherein the source electrode layer is electrically connected with the semiconductor layer via the first through hole, and the drain electrode layer is electrically connected with the semiconductor layer via the second through hole; and forming an active layer by etching the semiconductor layer at a location corresponding to the third through hole, wherein the gate electrode layer comprises a first part at the location corresponding to the third through hole and a second part, the second part of the gate electrode layer using a same pattern as the active layer and being different from the first part.

2. The method according to claim 1, wherein forming, on one side of a substrate, a gate electrode layer, a gate insulation layer located on the gate electrode layer and a semiconductor layer located on the gate insulation layer comprises:

forming a first metal layer on the substrate, and forming the gate electrode layer by patterning the first metal layer;

forming the gate insulation layer on the gate electrode layer;

forming a semiconductor material layer on the gate insulation layer; and forming the semiconductor layer by patterning the semiconductor material layer by taking the gate electrode layer as a mask.

3. The method according to claim 1, wherein forming, on one side of a substrate, a gate electrode layer, a gate insulation layer located on the gate electrode layer and a semiconductor layer located on the gate insulation layer comprises:

forming a first metal layer on the substrate, and forming the gate electrode layer by patterning the first metal layer;

forming the gate insulation layer on the gate electrode layer;

forming a semiconductor material layer on the gate insulation layer; and forming the semiconductor layer by patterning the semiconductor material layer by employing a mask which is utilized to form the gate electrode layer.

4. The method according to claim 1, wherein forming, on one side of a substrate, a gate electrode layer, a gate insulation layer located on the gate electrode layer and a semiconductor layer located on the gate insulation layer comprises:

forming, on the substrate, a first metal layer, a first insulation layer and a semiconductor material layer; and forming the semiconductor layer, the gate insulation layer and the gate electrode layer by patterning the first metal layer, the first insulation layer and the semiconductor material layer via a one-time patterning process by using a gate electrode layer mask plate.

5. The method according to claim 1, wherein along a direction perpendicular to the extension direction of the gate electrode layer, a length of the third through hole is larger than a length of the semiconductor layer that is exposed at the location corresponding to the third through hole.

6. The method according to claim 5, wherein along a direction perpendicular to an extension direction of the gate electrode layer, the range difference between a vertical projection of a boundary of the third through hole on the substrate and a vertical projection of a boundary of the semiconductor layer on the substrate that is exposed at the location corresponding to the third through hole is greater than or equal to 1.5 μm.

7. The method according to claim 1, wherein a vertical projection of the active layer on the substrate is located inside a vertical projection of the gate electrode layer on the substrate.

8. The method according to claim 7, wherein a range difference between a vertical projection of a boundary of the gate electrode layer on the substrate and a vertical projection of a boundary of the active layer on the substrate is greater than or equal to 1 μm.

9. The method according to claim 1, wherein the active layer is made of a metal oxide semiconductor.

10. The method according to claim 9, wherein the active layer is made of indium gallium zinc oxide.

11. The method according to claim 9, wherein forming the active layer by etching the semiconductor layer at the location corresponding to the third through hole comprises:

forming a fracture structure in the semiconductor layer by removing the semiconductor layer exposed at the location corresponding to the third through hole by using a first etching solution for forming the source electrode layer and the drain electrode layer or by using a metal oxide semiconductor etching solution, thereby forming the active layer.

12. An array substrate, comprising:

a substrate;

a gate electrode layer located on the substrate;

a gate insulation layer located on the gate electrode layer;

an active layer located on the gate insulation layer;

an etching stop layer located on the active layer; and a source electrode layer and a drain electrode layer located on the etching stop layer;

wherein the etching stop layer is provided with a first through hole, a second through hole and a third through hole; the source electrode layer is connected with the active layer via the first through hole, and the drain electrode layer is connected with the active layer via the second through hole; the active layer is separated at a location corresponding to the third through hole, a separated part of the active layer is connected with the third through hole, the gate electrode layer comprises a first part at the location corresponding to the third through hole and a second part, the second part of the gate electrode layer using a same pattern as the active layer and being different from the first part.

13. The array substrate according to claim 12, wherein a vertical projection of the active layer on the substrate is located inside a vertical projection of the gate electrode layer on the substrate.

14. The array substrate according to claim 13, wherein a range difference between a vertical projection of a boundary of the gate electrode layer on the substrate and a vertical projection of a boundary of the active layer on the substrate is greater than or equal to 1 μm.

15. The array substrate according to claim 12, wherein the active layer is made of a metal oxide semiconductor.

16. The array substrate according to claim 15, wherein, the active layer is made from indium gallium zinc oxide.

17. The array substrate according to claim 12, wherein the active layer is formed by etching the semiconductor layer at a location under the third through hole.

18. A display panel, comprising an array substrate which comprises:

a substrate;

a gate electrode layer located on the substrate;

a gate insulation layer located on the gate electrode layer;
an active layer located on the gate insulation layer;
an etching stop layer located on the active layer; and
a source electrode layer and a drain electrode layer located on the etching stop layer;
wherein the etching stop layer is provided with a first through hole, a second through hole and a third through hole; the source electrode layer is connected with the active layer via the first through hole, and the drain electrode layer is connected with the active layer via the second through hole; the active layer is separated at a location corresponding to the third through hole, a separated part of the active layer is connected with the third through hole, the gate electrode layer comprises a first part at the location corresponding to the third through hole and a second part, the second part of the gate electrode layer using a same pattern as the active layer and being different from the first part.

19. A display device, comprising a display panel which comprises an array substrate, wherein the array substrate comprises:

a substrate;
a gate electrode layer located on the substrate;
a gate insulation layer located on the gate electrode layer;
an active layer located on the gate insulation layer;
an etching stop layer located on the active layer; and
a source electrode layer and a drain electrode layer located on the etching stop layer;
wherein the etching stop layer is provided with a first through hole, a second through hole and a third through hole; the source electrode layer is connected with the active layer via the first through hole, and the drain electrode layer is connected with the active layer via the second through hole; the active layer is separated at a location corresponding to the third through hole, a separated part of the active layer is connected with the third through hole, the gate electrode layer comprises a first part at the location corresponding to the third through hole and a second part, the second part of the gate electrode layer using a same pattern as the active layer and being different from the first part.

* * * * *

UNITED STATES PATENT AND TRADEMARK OFFICE
CERTIFICATE OF CORRECTION

PATENT NO. : 10,056,410 B2
APPLICATION NO. : 15/403131
DATED : August 21, 2018
INVENTOR(S) : Chuanzhi Xu Page 1 of 1

It is certified that error appears in the above-identified patent and that said Letters Patent is hereby corrected as shown below:

On the Title Page

Add item (30), Foreign Application Priority Data as below:
Sep. 23, 2016 (CN).................. 201610848316.5

Signed and Sealed this
Sixteenth Day of October, 2018

Andrei Iancu
*Director of the United States Patent and Trademark Office*